United States Patent [19]

Buckley et al.

[11] 4,391,683

[45] Jul. 5, 1983

[54] MASK STRUCTURES FOR PHOTOETCHING PROCEDURES

[75] Inventors: Reginald R. Buckley, Summit; Frederick W. Ostermayer, Jr., Chatham, both of N.J.

[73] Assignee: Bell Telephone Laboratories, Incorporated, Murray Hill, N.J.

[21] Appl. No.: 416,495

[22] Filed: Sep. 10, 1982

[51] Int. Cl.³ .............................. C25F 3/12; C25F 3/14
[52] U.S. Cl. ............................. 204/129.3; 204/129.65
[58] Field of Search ........... 204/129.65, 129.3, 129.75, 204/129.8

[56] References Cited

U.S. PATENT DOCUMENTS 3,900,737  8/1982  Collier ........................ 250/492
4,351,706  9/1982  Chappell ..................... 204/129.65

OTHER PUBLICATIONS

IEEE Transactions on Electron Devices, vol. ED 22, No. 7, (Jul. 1975), "A Practical Electron Lithographic System".
Applied Physics Letters 39(1), p. 76, (1981).
Infrared Physics, 6, 1, (1966), by W. N. Carr.

Primary Examiner—T. M. Tufariello
Attorney, Agent, or Firm—Walter G. Nilsen

[57] ABSTRACT

A mask structure is described which is extremely useful for use in various photoetching processes where etching rate depends on radiation intensity on the etched surface. Such processes are extremely useful for producing various geometrical patterns on surfaces. The mask is made up of alternate areas of opaque and transparent areas which when introduced into an optical imaging system ordinary aberrations produce a pattern on the surface to be etched with the desired continuous spatial variation of radiation intensity. A particular advantage of the mask structure is that it can easily be made using an Electron Beam Exposure System. The mask is particularly useful for electrochemical photoetching processes carried out on compound semiconductors. The mask structure is usefully used to photoetch integral lenses on light emitting diodes. This photoetching process produces a variety of lens structures on LED devices with great accuracy. Also, a large array of lens structures are produced simultaneously which is highly advantageous economically.

30 Claims, 2 Drawing Figures

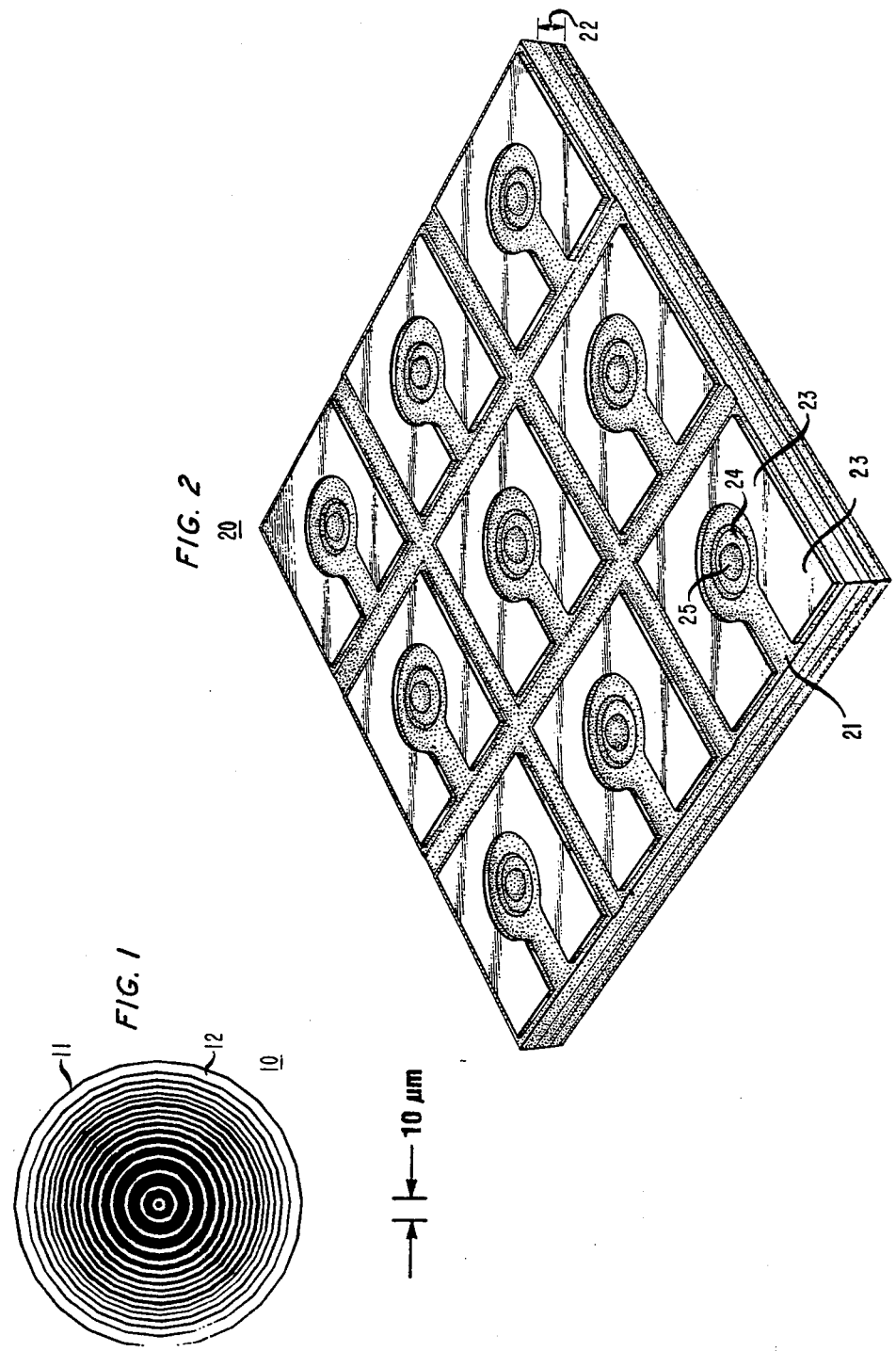

MASK STRUCTURES FOR PHOTOETCHING PROCEDURES

TECHNICAL FIELD

The invention involves the use of a special type mask in a photoetching process.

BACKGROUND OF THE INVENTION

In many processes used to fabricate devices, various kinds of photoetching processes are used. Such processes are highly advantageous in many instances because often etching can be confined to certain designated areas. Even more attractive are photoetching processes where the rate of etching is dependent on light intensity. Here, the possibility of etching various geometrical features directly on a surface (such as a lens on the surface of a light emitting diode or photodetector) becomes evident.

In addition, in many device fabrication procedures, large arrays of devices are fabricated simultaneously. Typical examples are in semiconducting processing such as the fabrication of semiconductor lasers, light emitting diodes, etc. Here, a semiconductor wafer is processed with many (generally more than 20 but often several hundred) individual devices on the wafer. A mask used for a photoetching process generally must have a repetitive pattern to reflect the large number of devices on the wafer. Also, the masks often have rather minute detail because of the small size of the individual devices and the detailed features of each individual device. It is also convenient that the mask structure be stable, relatively independent of radiation energy (wavelength of the light used in the photoetching process) and easily made.

A particular example of the above is a photoetching process for making integral lenses on light emitting diodes (LEDs). LED devices are fabricated on a semiconductor wafer, many such devices on each wafer. These devices are equally spaced on the wafer. Each LED device requires a lens of precise shape to collect radiation from the LED and direct such radiation in a particular direction (for example, coupling the radiation into an optical fiber). To obtain a lens of specific geometry using a photoetching technique, the spatial variation of the photoetching radiation must be very precise for each LED on the wafer. Particularly important for such a process is a mask structure which is easily and precisely made, is stable both as to dimensions and light transmission, and is relatively independent of the wavelength of the photoetching radiation used. This last requirement permits use of relatively broad-band radiation sources (such as a tungsten light source) for the photoetching process.

SUMMARY OF THE INVENTION

The invention is a process for masking a device in which at least one surface is photoetched using a mask and projection system of special design to produce a continuous spatial variation of light intensity. The mask for each device is made up of alternate transparent and opaque areas. These areas are of such width that on projecting an image of the mask through the projection system onto the surface to be etched, the spatial variation in radiation intensity is that required for the photoetching procedure being carried out. Generally, the spatial variations in radiation intensity are continuous and not abrupt and change no more than 50 percent between adjacent pairs of opaque and transparent areas. Particularly useful are masks with radial symmetry; that is, masks consisting of alternately opaque and transparent rings. These are used to photoetch geometric structures with spherical symmetry such as lenses on various optical structures. The width of the rings are adjusted to provide the spatial variation of radiation intensity required in the photoetching process. The optical system (e.g., lenses, mirrors) used to project the image of the mask on the surface to be etched contains sufficient aberrations or diffraction (diffraction, spherical and chromatic aberrations, coma, etc.) to blur out the individual rings and yield an average radiation intensity over the ring area as projected on the surface to be etched. Also, use of an electrochemical photoetching procedure on compound semiconductors yields excellent results as, for example, in etching lenses on LED structures. Particularly advantageous is the simultaneous etching of lenses on a large array (more than 50, often more than 200) of LED structures. The mask is conveniently made on Electron Beam Exposure System. Such masks are durable, can be used with broad-band irradiation systems (incandescent light sources), and produce intricate geometrical patterns with a high degree of accuracy.

BRIEF DESCRIPTION OF THE DRAWING

FIG. 1 shows a portion of a photomask made up of an array of alternately opaque and transparent rings;

FIG. 2 shows an array of photodiodes with lenses made in accordance with the invention.

DETAILED DESCRIPTION

In its broader aspects, the invention depends on the realization that a certain class of mask structures has significant advantages for use in photoetching processes where accurate continuous spatial variations in light intensity are of importance. This class of mask structures is made up of alternate areas of opaque and transparent material so that when imaged by an appropriate projection system onto a surface to be photoetched, the spatial variation of radiation intensity requird to photoetch a particular geometry is achieved.

The structure of the photomask is easiest discussed in terms of a ring structure (alternate opaque and transparent rings) as would be used to photoetch a geometrical feature with spherical symmetry such as a spherical lens. The width of the opaque and transparent rings is such as to produce the desired amount of radiation for the photoetch process in each surface area to be etched. For example, in regions where a small amount of photoetching is desired, the opaque rings are much wider than the transparent rings. Where etching is to be extensive, the transparent rings are wider than the opaque rings.

Although the masks can be made by a variety of procedures, the use of an Electron Beam Exposure System (EBES) is particularly convenient. Indeed, one of the advantages of this type of mask with alternate opaque and transparent areas is the ease of masking such masks with an EBES machine. EBES is described in a number of references including "A Practical Electron Lithographic System" by D. Herriott et al., *IEEE Transactions on Electron Devices*, Vol. ED 22, No. 7 (July 1975) and "Electron Beam Exposure System," U.S. Pat. No. 3,900,737, issued to R. J. Collier et al. on Aug. 19, 1975.

Masks are produced on a chromium coated glass plate. The EBES system uses addresses at 0.25 μm intervals, and a reasonably clean ring width of 1 μm is easily obtained. Magnification is also used in the optical system that projects the mask onto the surface to be etched. The complete mask is usually an array of identical patterns used to etch individual devices which are part of an array on a wafer. Often, these individual patterns are quite small, typically less than 200 μm or even 100 μm. Often, the individual devices on the wafer are quite small, less than 200 μm or even 100 μm. The calculation involved in designing an actual mask is given below.

The photomask is particularly useful as part of an electrochemical photoetching procedure. In this procedure, intrinsic and n-type compound semiconductors are etched by applying a suitable potential to the semiconductor and irradiating the surface to be etched with radiation of a suitable energy. A particular advantage of this etching process is that the rate of etching is closely dependent on and usually linear with the intensity of the light used to promote the etching process. Using this process, unusually intricate geometrical shapes can be etched on semiconductor surfaces with great accuracy. Particularly important in the practice of such an electrochemical photoetching procedure is the use of a photomask which can be easily made and which accurately produces intended spatial variations in light intensity.

It is convenient here to review the principles of electrochemical photoetching so as to set forth a preferred embodiment of the invention.

In the electrochemical photoetching process, the compound semiconductor is made part of an oxidation-reduction reaction. The compound semiconductor is made the anode and a counter-electrode (usually an inert metal such as platinum or platinized titanium) made the cathode. A potential is applied to the semiconductor, the value of which is discussed below. Etching results from a decomposition reaction induced by photogenerated holes at the interface between semiconductor and the electrolytic solution.

The process is useful for a large variety of semiconductor compounds including III–V compounds and II–VI compounds. Typical semiconductor compounds are CdS, CdSe, HgCdTe, GaP, GaAs, AlAs, AlP, AlSb, InSb, InAs, InP, GaInAs, GaInP, GaInAsP, GaAlP, and GaAlAs. Both intrinsic and n-type material may be etched by the inventive process. Intrinsic semiconductors refer to a class of semiconductors where the number of holes and electrons is nearly equal (usually with a factor of 100). Intrinsic semiconductors include undoped semiconductors and compensated semiconductors (semiconductors doped with traps to compensate for impurities or other dopants). Typically, such semiconductors are semi-insulating with resistivities greater than $10^6$ ohm-cm or more usually greater than $10^7$ or $10^8$ ohm-cm. However, it should be recognized that the etching process works on intrinsic compound semiconductors with much lower resistivities. Often, such materials are useful for substrates because of their semi-insulating characteristics.

Also included are n-type compound semiconductors where electron carriers exceed hole carriers. Usually, n-type semiconductors are obtained by substituting n-donors into the lattice (e.g., sulfur, selenium, or tellurium for group V elements or silicon for group III elements in a III–V semiconductor). Typical doping levels are $10^{15}$ to $10^{19}$ atoms per cubic centimeters, with $10^{16}$ to $10^{18}$ atoms per cubic centimeters preferred for many applications. The process is useful on compound semiconductors where radiation with energy greater than the band gap of semiconductor has a significant effect on the minority carrier population. In general, this means hole carrier population should not exceed electron carrier population in the compound semiconductor by more than a factor of 100.

An electric power source (i.e., battery, electronic power supply, etc.) is used to supply power for the electrochemical reaction and apply potential to the compound semiconductor. Meters are usually used in the circuit to measure potential (usually against a saturated Calomel electrode, SCE, also located in the electrolytic solution) and current. The current is proportional to the etch rate and therefore is a convenient monitor for the rate of etching in the process.

The potential on the compound semiconductor to be photoetched is particularly important because too high a potential will lead to etching in the absence of radiation, and too low a potential will prevent any etching even in the presence of radiation. As a general criteria, the potential should be between the maximum potential of the valence bond in the particular electrochemical solution being used and the flat band potential under these same conditions. The flat band potential is approximately the conduction band minimum for n-type compound semiconductors and about halfway between valence and conduction band for intrinsic compound semiconductors. Often these various potentials are known or can be found from various literature references. Typical values for n-type InP are $-0.5$ volts to $+1.2$ volts on the SCE scale in 1.0 molar hydrofluoric acid and 0.5 molar potassium fluoride. Best results are obtained in the range from $+0.2$ to $+0.5$ volts with $+0.3$ volts most preferred.

For n-type GaAs, the potential in the same solution is between $-0.8$ and 1.0 volts, with $-0.4$ to 0.4 preferred.

Where the relevant potentials are not known or where more accurate potentials are desired, a direct measurement of these quantities can be made by taking a voltammogram of the particular compound semiconductor. Here, the rate of etching is measured (by observing the current as described above) as a function of applied potential with and without radiation incident on the surface of the compound semiconductor. It is found that in one region of potential, high etching (as evidenced by high currents) is observed with radiation but essentially no etching (near zero current) without radiation. It is this region of potential that is of interest in the electrochemical photoetching process.

The nature of the electrolytic solution is also of importance in the electrochemical photoetching procedure. The solution should have sufficient conductivity to permit reasonable etching rates (generally greater than 0.0001 mhos/cm). This requirement is usually met by ingredients present in the solution for other reasons, but occasionally salts are added to promote conductivity in the solution. Generally, the solution should not contain any substances which would interfere in a detrimental way with the oxidation-reduction electrochemical reaction or the radiation procedure.

The most critical requirement of the electrolytic solution is that it remove the oxidation products of the photoetching process rapidly and in such a way as not to limit unduly the etching rate. High solubility of these oxidation products is certainly important. Also important is high rate of solubility and also perhaps that all the oxidation products exhibit these properties.

Both acids and bases may be used to accomplish this end, generally with pH values less than 5 or greater than 9. Preferably, the pH should be less than 3 or greater than 11 because of faster rates obtained. The alkaline solutions are usually made for the addition of alkaline agents such as sodium hydroxide or potassium hydroxide. Chelating agents may also be useful in ensuring rapid removal of the oxidation products of the etching procedure and may also be used to change the potential of the conduction band minimum and valence band maximum.

It has been found that the halogen acids HF, HCl, and HBr yield best results. These acids not only produce rapid etching but are also extremely stable with the potential used in the electrochemical photoetching procedure. Sulfuric acid solutions also yield excellent results with some compound semiconductors (i.e., GaAs) but should usually be avoided with compound semiconductors containing indium (i.e., InP).

The concentration of acid may vary over wide limits, including from about 0.05 molar to 10 molar, but best results are usually obtained in the range from 0.2 to 2.0 molar. In general, the particular acid preferred depends on convenience, etching speed required, and the nature of the surface required. For speed and convenience, particularly where damage-free etching is desired, hydrochloric acid is preferred. To obtain surfaces with good optical quality, hydrofluoric acid is preferred.

Various light sources may be used, provided at least part of the light source contains sufficient energy to create holes in the valence band at the surface of the compound semiconductor. This requirement is most easily met by using radiation with energy equal to or greater than the band gap of the compound semiconductor. Under some circumstances, light energy less than the band gap of the compound semiconductor may be used because of energy states in the band gap. Often, these energy states are due to impurities, doping elements, compensation elements, and crystal imperfections. However, for convenience and etching speed, radiation with energy greater than the band gap is preferred. Broad-band radiation (as from a tungsten lamp) or essentially monochromatic radiation (as from a laser) may be used. Lenses and other optical means may be used to achieve desired ray direction, concentration of radiation, etc.

The use of the inventive mask is particularly well illustrated in an electrochemical photoetching process for etching integral lenses on light emitting diodes. These lenses are used to collect radiation given off inside the diode and concentrate such radiation in a particular direction or angle. For example, the lens is used to couple more radiation from the diode into an optical fiber in an optical communication system.

The lens was etched on the substrate of an InGaAsP/InP light emitting diode. The substrate was (100) oriented n-type InP. The wafer on which the experiment was carried out contained a 9×9 array of such devices.

The procedure was carried out using an optical imaging apparatus. This apparatus is essentially a projection system in which an image of a photomask is projected onto the surface of a compound semiconductor wafer containing the individual LED devices to produce the desired light intensity pattern. In the projection system, an imaging lens (a Rodenstock Apo-Rodagon 50 mm, f 2.8 apochromatic enlarging lens) is used to project the photomask onto the semiconductor wafer held in place by a holder. The mask was illuminated by a projection light source comprising 100 watt tungsten-halogen lamp condensing system of aspheric collimating lens and a wafer filter. Also used is a lens to focus the filament onto the projection lens. A pellicle beam splitter between the projection lens and the cell directed reflected light from the wafer into a microscope with a long working distance to permit adjustment of the mask image. The cell, which was made of plexiglass, was mounted on a stage that allowed 3 translational and 3 rotational degrees of freedom. The orientation and transverse position of the cell were adjusted to align the wafer with respect to the mask image. The longitudinal positions of the lens and the cell were adjusted so that the magnification and focus were correct. The light intensity was adjusted with neutral density filters to give a current density less than 15 mA/cm$^2$. Also present in the electrochemical cell is a counter-electrode made of platinum metal and a SCE reference electrode. The electrochemical reaction was electrically powered by a potentiostat.

The electrolytic solution consisted of 1.5 molar HF and 0.5 molar KF (made up by adding appropriate amounts of 0.5 molar KOH to 2.0 molar HF). The potential applied to the wafer was between 0.1 and 0.4 volts on the SCE scale which yielded etch rates less than 0.5 $\mu$m per minute. Under these conditions, current density was directly proportional to light intensity. Although arbitrary lens shapes can be etched, for these experiments spherical lenses were etched since their light collection properties are easily calculated for comparing the expected performance with the actual performance.

Although arbitrary lens shapes can be etched, for these experiments spherical lenses were made since their light collection properties are more easily calculated for comparing expected performance with actual performance. The lenses are made by etching a crater in the n-type InP face leaving the lens in the center of the crater. The transmission function of the mask depends on the ratio of the minimum to the maximum transmission. This ratio should be as small as possible to minimize material removal. Constraints on the spherical variation of optical density that can be practically realized limit its smallness and a value of 0.1 was chosen as a reasonable compromise. Assuming uniform illumination and the maximum transmission to be one, the equation for the transmission T as a function of the radial position r on the mask then becomes $$T(r) = \begin{cases} \dfrac{R - 0.1\sqrt{R^2 - \left(\dfrac{D}{2}\right)^2} - 0.9\sqrt{R^2 - M^2 r^2}}{R - \sqrt{R^2 - \left(\dfrac{D}{2}\right)^2}} & r < \dfrac{D}{2M} \\ 1 & r > \dfrac{D}{2M} \end{cases}$$

where R is the desired radius of curvature of the lens, D is the diameter of the lens in the plane of the substrate surface, and M is the magnification with which the mask is to be projected onto the surface. This will produce the spherical lens when the region surrounding the lens is etched to a depth of $$\frac{10}{9}\left(R - \sqrt{R^2 - \left(\frac{D}{2}\right)^2}\right).$$

For our LED and optical fiber, values of R=75 μm and D=62.5 μm were near optimum.

The mask 10 used to etch this lens structure is shown in FIG. 1. The mask is made up of alternate rings of transparent 12 and opaque 11 rings. The radii of the rings were chosen so that the average transmission through adjacent pairs matched the transmission given by the above equation at the boundary between the pair. The mask features (ring widths, overall mask sizes) are so small that the actual features on the surface to be etched are smeared out by one or more of the following: (1) Fraunhofer diffraction due to the limited aperture of the lens in the imaging apparatus, and (2) aberrations in the lens in the imaging system, such as chromatic aberrations, spherical aberrations, etc. In general, the size of the features in the mask are very small, often ring thicknesses of less than 10 or even 5 or even 1 μm.

The mask was fabricated by an Electron Beam Exposure System (EBES) which produces the pattern in a chromium coated glass plate. In calculating the ring widths, the reflection of the glass (~8.0%) and the finite transmission of the chromium film (≦0.5%) were neglected. The EBES system uses addresses at 0.25 μm intervals and a reasonably clean ring width of 1 μm can be achieved. With this minimum ring width, the mask was designed to be projected onto the surface with a magnification M=0.5 and consisted of a 9×9 array of patterns. The magnification of 0.5 was chosen as a compromise between obtaining a smoothly varying light intensity on the LED surface from the ring pattern of the mask and being able to process as large a wafer as possible without having to step and repeat.

The lenses are etched on the wafer after the application of ohmic contacts. To insure that the lenses are centered opposite the p-contacts which define the light spot, an auxiliary photoresist step was introduced. The wafer is mounted with its p-side waxed to a glass disk. A mask for defining 150 μm diameter holes in photoresist on the n-side is aligned to the p-contacts by using an infrared microscope to observe radiation transmitted through the wafer. The lens patterns are centered in these openings. After etching the lenses, the photoresist is stripped in an oxygen plasma and the final processing steps continued. Before photoetching the lenses, it has been found to be beneficial to etch the substrate in H$_2$SO$_4$:30% H$_2$O$_2$:H$_2$O (1:1:10) for 1 min. to remove surface damage that inhibits photoetching in some regions showed no evidence of a ring structure.

The lenses were etched to a height of 7 μm. To achieve this, the surrounding region had to be etched to a depth of 10 μm (total etch time ≈20 min.). This was consistent with a microphotometer measurement which gave a value of 0.14 for the ratio of the light intensity at the center to the surrounding region in the image of the lens spot but was greater than the value of 0.1 for which the mask was designed. This reduction in the contrast of the image could result from aberrations and scattering in the projection lens.

FIG. 2 shows part of an array of LED structures 20 with the various layers 22 on the LED structures and the n-type InP substrate 21. Also shown is a metal layer 23 and the crater 24 containing the lens 25 made in accordance with the invention.

The power butt-coupled into a loop feeder optical fiber (core diam.=62.5 μm, N.A.=0.3) from LEDs from the same wafer with and without lenses was measured. On the average 60 percent more power was coupled from the LEDs with lenses. This improvement agreed to within experimental error with a calculated value based on a measured light spot diameter of 40 μm. This indicated that the scattering losses of these lenses is very small and the mask structure accurately produced the desired lens shape. The experiments further show that large arrays of devices can be photoetched to accurate geometries simultaneously using the inventive mask.

Similar results are obtained with other compound semiconductors such as InGaAs, InGaAsP, GaAs, and GaAlAs.

What is claimed is:

1. A process for fabricating a device comprising the step of photoetching a surface where etching rate depends on radiation intensity incident on said surface characterized in that the mask comprises alternating opaque and transparent areas and the mask is imaged onto the surface by an optical system with aberrations and diffraction so as to produce radiation intensity on the surface that varies continuously with position.

2. The process of claim 1 in which the mask comprises alternating opaque and transparent rings.

3. The process of claim 2 in which the rings have thickness less than 10 μm.

4. The process of claim 3 in which the rings have thickness of less than 5 μm.

5. The process of claim 1 in which the size of the mask is less than 100 μm.

6. The process of clam 5 in which the size of the mask is less than 50 μm.

7. The process of claim 1 in which the mask is part of an array of masks with more than 20 masks in the array.

8. The process of claim 1 in which the surface to be etched is the surface of a compound semiconductor and the photoetching process is an electrochemical photoetching process in which electric current is passed through the compound semiconductor, electrolytic solution with conductivity greater than 0.0001 mhos/cm and a cathode characterized in that the step further comprises
   a. applying a potential to the semiconducting compound which is between the maximum potential of the valence band of the semiconductor compound in the electrolytic solution and the minimum potential of the conduction band of the semiconductor compound in the electrolytic solution;
   b. illuminating the part of the surface of the compound semiconductor to be etched with radiation of sufficient energy to produce holes in the valence bond;
   c. including the composition of the species from the surface of the compound semiconductor.

9. The process of claim 8 in which the compound semiconductor is a II–VI compound semiconductor.

10. The process of claim 9 in which the compound semiconductor is selected from the group consisting of CdS, CdSe, HgCdTe.

11. The process of claim 8 in which the compound semiconductor is a III–V compound semiconductor.

12. The process of claim 11 in which the compound semiconductor is selected from the group consisting of GaP, GaAS, AlAs, AlP, AlSb, InSb, InAs, InP, GaInAs, GaInP, GaInAsP, GaAlP and GaAlAs.

13. The process of claim 8 in which the pH of the electrolytic solution is greater than 9.

14. The process of claim 13 in which the pH is greater than 11.

15. The process of claim 8 in which the pH of the electrolytic solution is less than 5.

16. The process of claim 15 in which the pH is 3.2.

17. The process of claim 8 in which the electrolytic solution comprises an acid selected from the group consisting of HF, HCl, and HBr.

18. The process of claim 8 in which the acid is hydrofluoric acid with concentration range between 0.01 and 5 molar.

19. The process of claim 18 in which the concentration of hydrofluoric acid is between 0.5 and 2 molar.

20. The process of claim 19 in which salts are added to promote conductivity.

21. The process of claim 20 in which the salt is a fluoride salt with concentration range from 0.1 to 2 molar.

22. The process of claim 8 in which the compound semiconductor is n-type InP and the potential on the SCE scale is between −0.5 and +1.2 volts.

23. The process of claim 22 in which the potential on the SCE scale is between 0.2 and 0.5 volts.

24. The process of claim 8 in which the compound semiconductor is n-type GaAs and the potential is between −0.8 and 1.0 volts.

25. The process of claim 24 in which the potential is between −0.4 and +0.4 volts.

26. The process of claim 8 in which the device is a light emitting diode.

27. The process of claim 26 in which the etching procedure produces a lens on the light emitting diode.

28. The process of claim 27 in which the etched lens is on the substrate of the light emitting diode.

29. The process of claim 28 in which the substrate is n-type InP.

30. The process of claim 29 in which the photomask comprises alternating opaque and transparent rings of such width that the average transmission through adjacent pairs of rings equals the transmission given by $$T(r) = \begin{cases} \dfrac{R - 0.1\sqrt{R^2 - \left(\dfrac{D}{2}\right)^2} - 0.9\sqrt{R^2 - M^2 r^2}}{R - R^2 - \left(\dfrac{D}{2}\right)^2} & r < \dfrac{D}{2M} \\ 1 & r > \dfrac{D}{2M} \end{cases}$$

* * * * *